United States Patent
Chen

(10) Patent No.: US 8,248,148 B2
(45) Date of Patent: Aug. 21, 2012

(54) POWER SUPPLY SWITCH APPARATUS

(75) Inventor: Chi-Wen Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 68 days.

(21) Appl. No.: 12/962,599

(22) Filed: Dec. 7, 2010

(65) Prior Publication Data

US 2012/0133421 A1    May 31, 2012

(30) Foreign Application Priority Data

Nov. 29, 2010   (TW) ............................... 99141169 A

(51) Int. Cl.
*H03K 17/687* (2006.01)
(52) U.S. Cl. ......... 327/434; 327/365; 327/389; 327/427
(58) Field of Classification Search ........... 327/365–508
See application file for complete search history.

(56) References Cited

U.S. PATENT DOCUMENTS

| 5,138,186 | A | * | 8/1992 | Dumbovic | 327/91 |
| 5,650,741 | A | * | 7/1997 | Nakamura et al. | 327/327 |
| 2009/0167410 | A1 | * | 7/2009 | Yoshikawa et al. | 327/427 |
| 2009/0179685 | A1 | * | 7/2009 | Yanagigawa et al. | 327/387 |
| 2011/0163792 | A1 | * | 7/2011 | Ando | 327/403 |
| 2012/0049930 | A1 | * | 3/2012 | Han | 327/434 |

* cited by examiner

*Primary Examiner* — Lincoln Donovan
*Assistant Examiner* — Brandon S Cole
(74) *Attorney, Agent, or Firm* — Altis Law Group, Inc.

(57) ABSTRACT

A power supply switch apparatus includes a main outlet, first and second load outlets, a manual switch, and first and second electronic switches. The positive terminal of the main outlet is connected to the positive terminal of the first load outlet and connected to the second terminal of the first electronic switch. The third terminal of the first electronic switch is connected to the positive terminal of the second load outlet. The first terminal of the first electronic switch is connected to the second terminal of the second electronic switch and connected to a voltage terminal through a first resistor. The third terminal of the second electronic switch is grounded. The first terminal of the second electronic switch is connected to the voltage terminal through the manual switch and a second resistor in that order, and grounded through a third resistor.

4 Claims, 3 Drawing Sheets

POWER SUPPLY SWITCH APPARATUS

BACKGROUND

1. Technical Field

The present disclosure relates to a power supply switch apparatus.

2. Description of Related Art

In a server, there is a power supply unit (PSU) to supply power to a number of parallel loads at the same time. Commonly, positive terminals of the loads are electrically connected together by power cables, and negative terminals of the loads are electrically connected together by power cables. However, when the server is tested, the power cables need to be manually connected to and disconnected from the positive terminals and negative terminals of the loads many times, which increases wear on the parts involved, increases chance of operator error, and is labor intensive and therefore costly.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
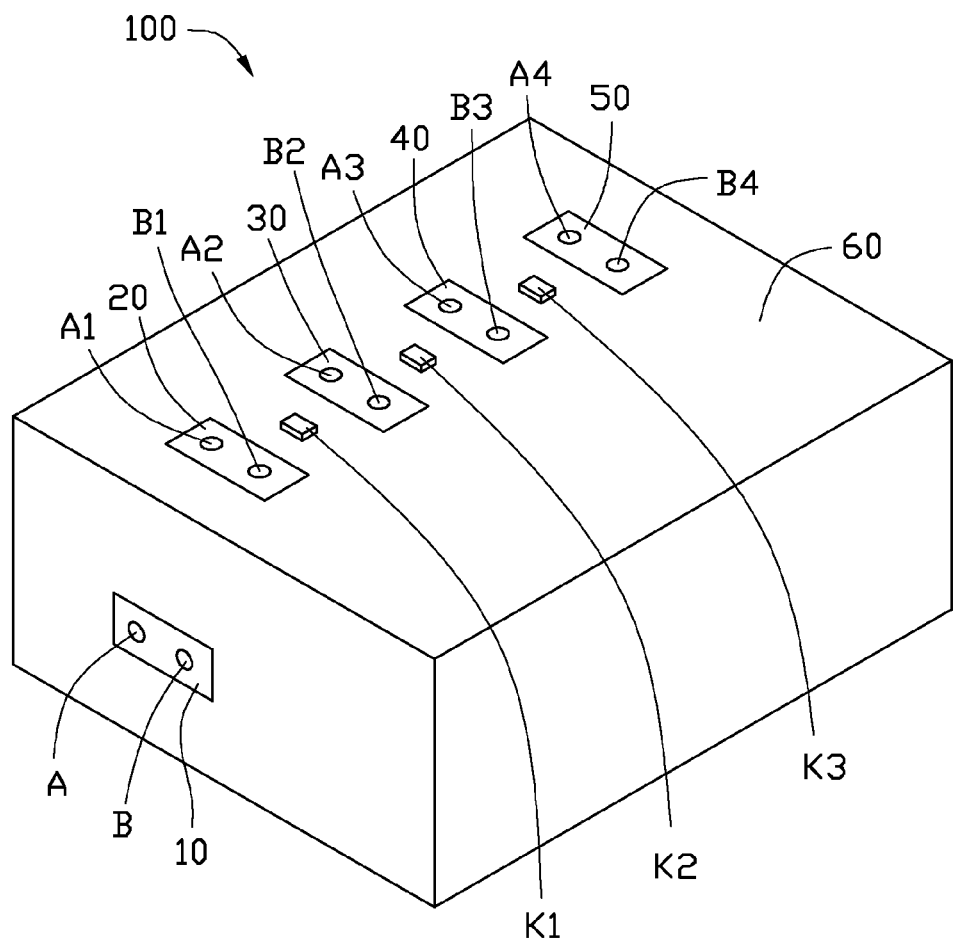
FIG. 1 is an isometric, schematic view of an embodiment of a power supply switch apparatus.
Figure 2:
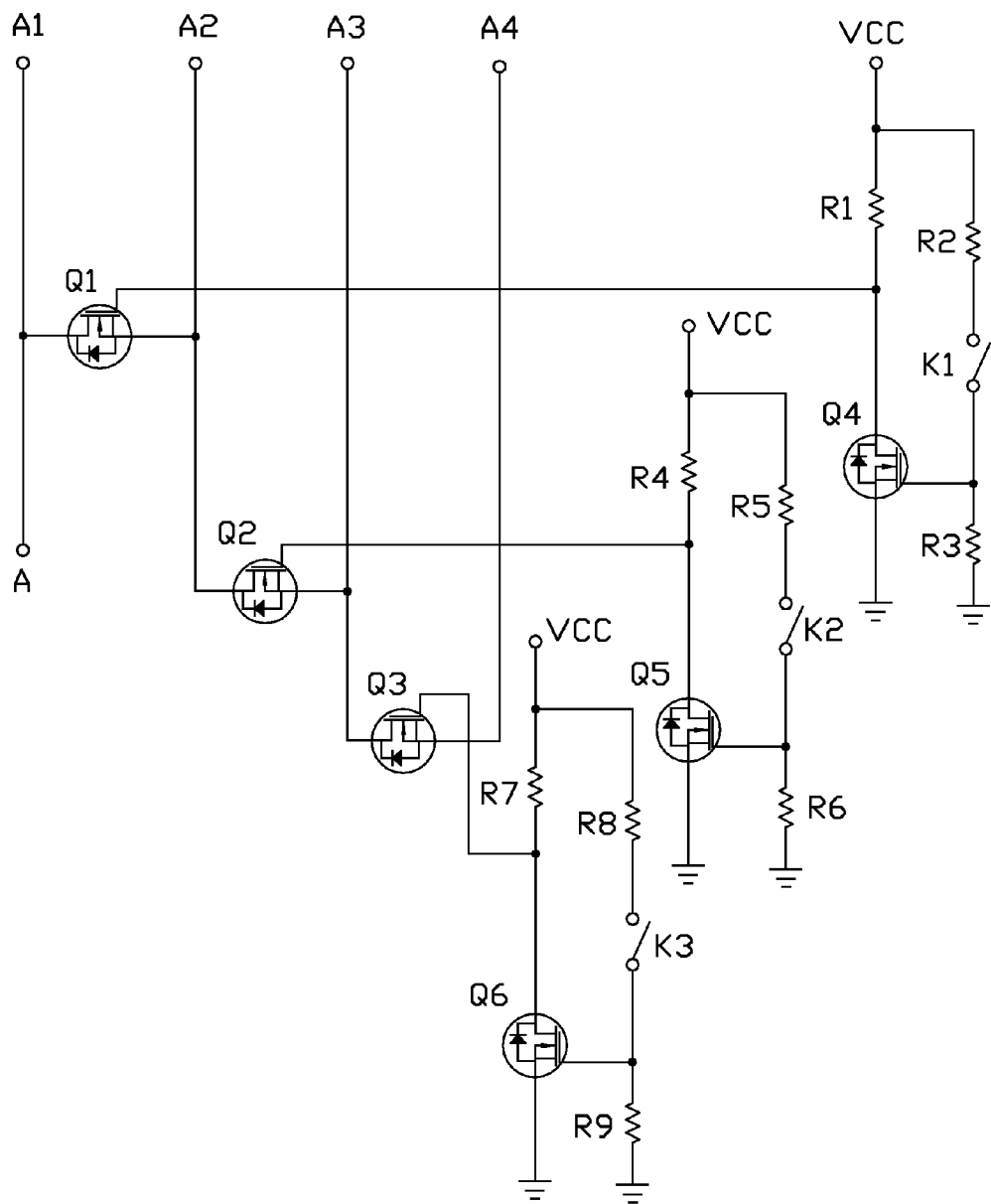
FIG. 2 is a circuit diagram of the power supply switch apparatus of FIG. 1.

Referring to FIGS. 1 and 2, an embodiment of a power supply switch apparatus 100 includes a main outlet 10, first to fourth load outlets 20, 30, 40, and 50, first to third manual switches K1-K3, six electronic switches Q1-Q6, and nine resistors R1-R9.

In one embodiment, the main outlet 10, the first to fourth load outlets 20, 30, 40, and 50, and the first to third manual switches K1-K3 are mounted on a case 60, and the other elements are arranged in the case 60. The electronic switches Q1-Q6 are n-channel metal-oxide-semiconductor (NMOS) field effect transistors (FETs). Each of the electronic switches Q1-Q6 includes first to third terminals respectively corresponding to a gate, a drain, and a source of the NMOS FET. In other embodiments, the electronic switches Q1-Q6 can be exchanged with other types of electronic switches, such as bipolar transistors.

The main outlet 10 includes a positive terminal A and a negative terminal B. The first to fourth load outlets 20, 30, 40, and 50 respectively include a positive terminal A1 and a negative terminal B1, a positive terminal A2 and a negative terminal B2, a positive terminal A3 and a negative terminal B3, and a positive terminal A4 and a negative terminal B4. In other embodiments, the number of the load outlets can be changed according to requirements.

The negative terminal B of the main outlet 10 is directly connected to the negative terminals B1-B4 of the first to fourth load outlets 20, 30, 40, and 50, and connected to ground, these connection relationship among the negative terminals B, B1-B4 connected to ground falls within well-known technologies, and are therefore not shown in drawings. The positive terminal A of the main outlet 10 is connected to the positive terminal A1 of the first load outlet 20, and connected to the second terminal of the electronic switch Q1. The third terminal of the electronic switch Q1 is connected to the positive terminal A2 of the second load outlet 30 and the second terminal of the electronic switch Q2. The third terminal of the electronic switch Q2 is connected to the positive terminal A3 of the third load outlet 40 and the second terminal of the electronic switch Q3. The third terminal of the electronic switch Q3 is connected to the positive terminal A4 of the fourth load outlet 50.

The first terminal of the electronic switch Q1 is connected to the second terminal of the electronic switch Q4, and connected to a voltage terminal VCC through the resistor R1. The third terminal of the electronic switch Q4 is grounded. The first terminal of the electronic switch Q4 is connected to the voltage terminal VCC through the first manual switch K1 and the resistor R2 in that order, and grounded through the resistor R3. The first terminal of the electronic switch Q2 is connected to the second terminal of the electronic switch Q5 and connected to the voltage terminal VCC through the resistor R4. The third terminal of the electronic switch Q5 is grounded. The first terminal of the electronic switch Q5 is connected to the voltage terminal VCC through the second manual switch K2 and the resistor R5 in that order, and grounded through the resistor R6. The first terminal of the electronic switch Q3 is connected to the second terminal of the electronic switch Q6, and connected to the voltage terminal VCC through the resistor R7. The third terminal of the electronic switch Q6 is grounded. The first terminal of the electronic switch Q6 is connected to the voltage terminal VCC through the third manual switch K3 and the resistor R8 in that order, and grounded through the resistor R9.

Figure 3:
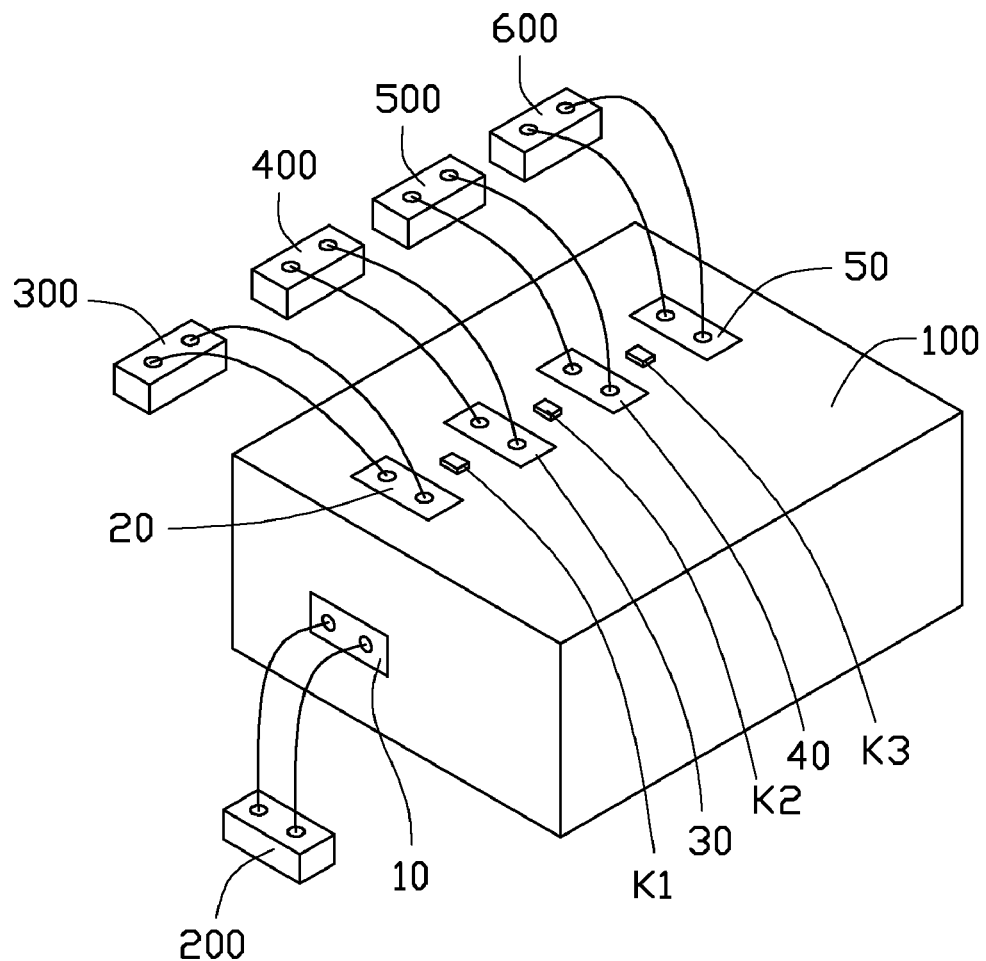
FIG. 3 is an isometric, schematic view of the power supply switch apparatus of FIG. 1, connected to a main power supply and four loads.

Referring to FIG. 3, when the power supply switch apparatus 100 is used to connect a main power supply 200 to four loads 300, 400, 500, and 600, the positive and negative terminals of the main power supply 200 are respectively connected to the positive terminal A and the negative terminal B of the main outlet 10. The positive and negative terminals of the load 300 are respectively connected to the positive terminal A1 and the negative terminal B1 of the first load outlet 20. The positive and negative terminals of the load 400 are respectively connected to the positive terminal A2 and the negative terminal B2 of the second load outlet 30. The positive and negative terminals of the load 500 are respectively connected to the positive terminal A3 and the negative terminal B3 of the third load outlet 40. The positive and negative terminals of the load 600 are respectively connected to the positive terminal A4 and the negative terminal B4 of the fourth load outlet 50.

After making the above connections, the first to third manual switches K1-K3 are all turned on, therefore the electronic switches Q4-Q6 are turned on and the electronic switches Q1-Q3 are turned off. At this time, only the load 300 can work. If the first manual switch K1 is turned off, the electronic switch Q4 is turned off and the electronic switch Q1 is turned on, therefore the loads 300 and 400 can work together. If the second manual switch K2 is turned off, the electronic switch Q5 is turned off and the electronic switch Q2 is turned on, therefore the loads 300, 400, and 500 can work together. If the third manual switch K3 is turned off, the electronic switch Q6 is turned off and the electronic switch Q3 is turned on, therefore the loads 300, 400, 500, and 600 can work together. Therefore, the loads 300, 400, 500, and 600 can be selectively turned, which is very convenient, less labor intensive, and less wearing on parts and therefore less costly.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A power supply switch apparatus comprising:
   a main outlet comprising a positive terminal and a negative terminal;
   a first load outlet and a second load outlet each comprising a positive terminal and a negative terminal;
   a first manual switch;
   first to third resistors; and
   a first electronic switch and a second electronic switch each comprising first to third terminals, wherein each electronic switch is turned on in response to the first terminal being at a high voltage state;
   wherein the positive terminal of the main outlet is connected to the positive terminal of the first load outlet and connected to the second terminal of the first electronic switch, the third terminal of the first electronic switch is connected to the positive terminal of the second load outlet, the first terminal of the first electronic switch is connected to the second terminal of the second electronic switch and connected to a voltage terminal through the first resistor, the third terminal of the second electronic switch is grounded, the first terminal of the second electronic switch is connected to the voltage terminal through the first manual switch and the second resistor in that order, and grounded through the third resistor.

2. The power supply switch apparatus of claim 1, further comprising:
   a third load outlet comprising a positive terminal and a negative terminal;
   a second manual switch;
   fourth to sixth resistors; and
   a third electronic switch and a fourth electronic switch each comprising first to third terminals, wherein each electronic switch is turned on in response to the first terminal being at a high voltage state;
   wherein the third terminal of the first electronic switch is connected to the second terminal of the third electronic switch, the third terminal of the third electronic switch is connected to the positive terminal of the third load outlet, the first terminal of the third electronic switch is connected to the second terminal of the fourth electronic switch and connected to the voltage terminal through the fourth resistor, the third terminal of the fourth electronic switch is grounded, the first terminal of the fourth electronic switch is connected to the voltage terminal through the second manual switch and the fifth resistor in order, and grounded through the sixth resistor.

3. The power supply switch apparatus of claim 2, further comprising:
   a fourth load outlet comprising a positive terminal and a negative terminal;
   a third manual switch;
   seventh to ninth resistors; and
   a fifth electronic switch and a sixth electronic switch each comprising first to third terminals, wherein each electronic switch is turned on in response to the first terminal being at a high voltage state;
   wherein the third terminal of the third electronic switch is connected to the second terminal of the fifth electronic switch, the third terminal of the fifth electronic switch is connected to the positive terminal of the fourth load outlet, the first terminal of the fifth electronic switch is connected to the second terminal of the sixth electronic switch and connected to the voltage terminal through the seventh resistor, the third terminal of the sixth electronic switch is grounded, the first terminal of the sixth electronic switch is connected to the voltage terminal through the third manual switch and the eighth resistor in order, and grounded through the ninth resistor.

4. The power supply switch apparatus of claim 3, wherein the first to sixth electronic switches are n-channel mental-oxide-semiconductor (NMOS) field effect transistors (FETs), the first to third terminals are respectively corresponding to gates, drains, and sources of the NMOS FETs.

* * * * *